(12) United States Patent
Jeong et al.

(10) Patent No.: US 9,224,900 B2
(45) Date of Patent: Dec. 29, 2015

(54) DISPLAY DEVICE AND MANUFACTURING METHOD THEREOF

(75) Inventors: Ki-Hun Jeong, Cheongan-si (KR); Sung-Hoon Yang, Seoul (KR); Kap-Soo Yoon, Seoul (KR); Kyung-Sook Jeon, Yongin-si (KR); Seung Mi Seo, Seoul (KR)

(73) Assignee: SAMSUNG DISPLAY CO., LTD. (KR)

( * ) Notice: Subject to any disclaimer, the term of this patent is extended or adjusted under 35 U.S.C. 154(b) by 1253 days.

(21) Appl. No.: 12/899,409

(22) Filed: Oct. 6, 2010

(65) Prior Publication Data
US 2011/0109609 A1    May 12, 2011

(30) Foreign Application Priority Data
Nov. 9, 2009  (KR) .................. 10-2009-0107651

(51) Int. Cl.
*H01L 31/113* (2006.01)
*G02F 1/133* (2006.01)

(52) U.S. Cl.
CPC ........ *H01L 31/1136* (2013.01); *G02F 1/13318* (2013.01); *G06F 2203/04103* (2013.01)

(58) Field of Classification Search
CPC ................................................ G02F 1/13318

USPC ............................................................ 349/44
See application file for complete search history.

(56) References Cited

U.S. PATENT DOCUMENTS

| 5,648,662 | A | * | 7/1997 | Zhang et al. ................... 257/59 |
| 5,672,888 | A | * | 9/1997 | Nakamura ..................... 257/72 |
| 6,100,954 | A | * | 8/2000 | Kim et al. ..................... 349/138 |
| 2006/0102972 | A1 | * | 5/2006 | Bhattacharyya .............. 257/432 |
| 2008/0121442 | A1 | * | 5/2008 | Boer et al. ................. 178/18.09 |
| 2009/0072226 | A1 | * | 3/2009 | Koo et al. ........................ 257/40 |
| 2009/0117692 | A1 | * | 5/2009 | Koyama et al. ............... 438/164 |
| 2009/0140259 | A1 | * | 6/2009 | Yamazaki ....................... 257/67 |
| 2009/0179202 | A1 | * | 7/2009 | Hong et al. ..................... 257/59 |
| 2010/0117091 | A1 | * | 5/2010 | Kaitoh et al. ................... 257/72 |
| 2010/0301326 | A1 | * | 12/2010 | Miyairi et al. ................. 257/43 |

FOREIGN PATENT DOCUMENTS

KR    1020040090154    * 10/2004

* cited by examiner

*Primary Examiner* — Nathanael R Briggs
*Assistant Examiner* — Alexander Gross
(74) *Attorney, Agent, or Firm* — Innovation Counsel LLP

(57) ABSTRACT

A touch sensitive display device utilizing infrared ray sensing transistors. The transistors are configured, and comprise specified materials, to allow them to be formed with fewer photolithography processes, reducing cost and manufacturing time.

7 Claims, 14 Drawing Sheets

DISPLAY DEVICE AND MANUFACTURING METHOD THEREOF

CROSS-REFERENCE TO RELATED APPLICATION

This application claims priority to, and the benefit of, Korean Patent Application No. 10-2009-0107651 filed in the Korean Intellectual Property Office on Dec. 9, 2009, the entire contents of which are incorporated herein by reference.

BACKGROUND OF THE INVENTION (a) Field of the Invention

The present invention relates generally to flat panel displays. More specifically, the invention relates to touch-screen flat panel displays.

(b) Description of the Related Art

Liquid crystal displays (LCDs) have found recent application in touch-sensitive devices, such as touch screens. However, it has historically been difficult to develop reliable such displays. Ongoing efforts thus exist to increase the reliability of LCD touch-sensitive devices. The above information disclosed in this Background section is only for enhancement of understanding of the background of the invention. It may thus contain information not in the prior art.

SUMMARY OF THE INVENTION

The present invention can reduce the number of photolithography processes for manufacturing an infrared ray sensing transistor, a visible ray sensing transistor, and a readout transistor.

A display device according to an exemplary embodiment of the present invention includes: a lower panel including a lower substrate and a pixel transistor disposed on the lower substrate; and an upper panel facing the lower panel, the upper panel including an upper substrate, an infrared sensing transistor disposed on the upper substrate, and a readout transistor connected to the infrared ray sensing transistor and transmitting a detection signal responsive to the sensing transistor. The infrared sensing transistor includes a source semiconductor layer and a drain semiconductor layer separated from each other on the upper substrate, a source electrode and a drain electrode respectively disposed on the source semiconductor layer and the drain semiconductor layer, an upper semiconductor layer disposed on the source electrode and the drain electrode, and a gate electrode overlapping the first upper semiconductor layer. The source semiconductor layer and the drain semiconductor layer each have an upper surface facing the upper substrate, a lower surface opposite the upper surface, and a side surface extending between the upper and lower surfaces, the upper semiconductor layer contacting the side surfaces of the source semiconductor layer and the drain semiconductor layer.

The display device can also include a blocking insulating layer having an upper surface facing the upper substrate, and a lower surface facing the first source lower semiconductor layer and the first drain lower semiconductor layer. A channel of the upper semiconductor layer is disposed between the source electrode and the drain electrode, and contacts the blocking insulating layer.

The readout transistor may include a lower gate electrode disposed on the upper substrate, a lower semiconductor layer disposed on and overlapping the lower gate electrode, a source electrode and a drain electrode each positioned on the lower semiconductor layer, a source semiconductor layer and a drain semiconductor layer respectively disposed on the source electrode and the drain electrode and separated from each other, and an upper gate electrode overlapping the lower semiconductor layer.

The upper semiconductor layer of the infrared sensing transistor, and the source and drain semiconductor layers of the readout transistor each include amorphous silicon germanium. Also, the source and drain semiconductor layers of the infrared sensing transistor, and the lower semiconductor layer of the readout transistor each include amorphous silicon.

A light blocking film may also be included, where the light blocking film has an upper surface facing the upper substrate and a lower surface opposite the upper surface, the lower surface facing the source semiconductor layer and drain semiconductor layer.

A lower ohmic contact layer can formed between the source semiconductor layer and the source electrode, and between the drain semiconductor layer and the drain electrode. An upper ohmic contact layer can be formed between the source electrode and the upper semiconductor layer, and between the drain electrode and the upper semiconductor layer.

A readout transistor can include a lower semiconductor layer disposed on the upper substrate, a source electrode and a drain electrode each positioned on the lower semiconductor layer, and a source semiconductor layer and a drain semiconductor layer respectively disposed on the source electrode and the drain electrode and separated from each other. A lower ohmic contact layer can be formed between the lower semiconductor layer of the readout transistor and the source electrode of the readout transistor, and between the lower semiconductor layer of the readout transistor and the drain electrode of the readout transistor. Also, an upper ohmic contact layer can be formed between the source electrode of the readout transistor and the source semiconductor layer of the readout transistor, and between the drain electrode of the readout transistor and the drain semiconductor layer of the readout transistor.

Further, a display device according to another exemplary embodiment of the present invention includes: a lower panel including a lower substrate and a pixel transistor disposed on the lower substrate; and an upper panel facing the lower panel, and including an upper substrate, an infrared ray sensing transistor disposed on the upper substrate, and a readout transistor connected to the infrared ray sensing transistor and transmitting a detection signal, wherein the infrared ray sensing transistor includes a first lower semiconductor layer disposed on the upper substrate, a first source electrode and a first drain electrode each disposed on the first lower semiconductor layer, a first upper semiconductor layer disposed on the first source electrode and the first drain electrode, a first gate electrode overlapping the first upper semiconductor layer, and a separating layer disposed between the first lower semiconductor layer and a channel of the first upper semiconductor layer, the channel of the first semiconductor layer positioned generally between the first source electrode and first drain electrode.

The separating layer may include a nitrogen oxide.

The readout transistor may include a second lower gate electrode disposed on the upper substrate, a second lower semiconductor layer disposed on the second gate electrode and overlapping the second gate electrode, a second source electrode and a second drain electrode each positioned on the second lower semiconductor layer, a second source upper semiconductor layer and a second drain upper semiconductor layer respectively disposed on the second source electrode and the second drain electrode and separated from each other, and a second upper gate electrode overlapping the second lower semiconductor layer.

The first upper semiconductor layer, the second source upper semiconductor layer, and the second drain upper semiconductor layer may each include amorphous silicon germanium, and the first lower semiconductor layer and the second lower semiconductor layer may each include amorphous silicon.

A light blocking film disposed between upper substrate and the first lower semiconductor layer, and under the second lower gate electrode, may be further included.

A first lower ohmic contact layer having a first surface facing the first lower semiconductor layer and the first source electrode, and a second surface facing the first lower semiconductor layer and the first drain electrode, and a first upper ohmic contact layer having a first surface facing the first source electrode and the first upper semiconductor layer, and a second surface facing the first drain electrode and the first upper semiconductor layer, may be further included.

A second lower ohmic contact layer having a first surface facing the second lower semiconductor layer and the second source electrode, and a second surface facing the second lower semiconductor layer and the second drain electrode, and a second upper ohmic contact layer having a first surface facing the second source electrode and the second source upper semiconductor layer, and a second surface facing the second drain electrode and the second source upper semiconductor layer, may be further included.

A method for manufacturing a display device according to an exemplary embodiment of the present invention includes: sequentially forming a lower semiconductor material and a conductive layer on a substrate; etching the lower semiconductor material and the conductive layer to form a first source lower semiconductor layer of an infrared ray sensing transistor, a first drain lower semiconductor layer of the infrared ray sensing transistor, a first source electrode of the infrared ray sensing transistor, a first drain electrode of the infrared ray sensing transistor, a second lower semiconductor layer of a readout transistor, and a conductive pattern of the readout transistor; forming an upper semiconductor material on the first source electrode, the first drain electrode, and the conductive pattern; etching the upper semiconductor material and the conductive pattern to form a first upper semiconductor layer of the infrared ray sensing transistor, a second source electrode of the readout transistor, a second drain electrode of the readout transistor, a second source upper semiconductor layer of the readout transistor, and a second drain upper semiconductor layer of the readout transistor; and forming a gate insulating layer on the first upper semiconductor layer, the second source upper semiconductor layer, the second drain upper semiconductor layer, and the second lower semiconductor layer, wherein the first source lower semiconductor layer and the first drain lower semiconductor layer of the infrared ray sensing transistor are separated from each other, and the second source upper semiconductor layer and the second drain upper semiconductor layer of the readout transistor are separated from each other.

The gate insulating layer may be formed on the second lower semiconductor layer between the second source electrode and the second drain electrode.

Forming a lower ohmic contact material between the lower semiconductor material and the conductive layer, and forming an upper ohmic contact material on the conductive layer, may be further included.

Before forming the lower semiconductor material, a light blocking material and a gate conductive layer are sequentially formed, the light blocking material and the gate conductive layer are etched to form a light blocking film and a second lower gate electrode of the readout transistor, and a blocking insulating layer is formed on the substrate, the light blocking film, and the second lower gate electrode.

The etching the light blocking material may further comprise forming the light blocking film and the second lower gate electrode of the readout transistor by etching the light blocking material and the gate conductive layer with a first photosensitive film pattern positioned on the gate conductive layer, the first photosensitive film pattern including a first portion and a second portion that is thinner than the first portion.

The method may also include forming a first upper gate electrode on the gate insulating layer, the first upper gate electrode overlapping a channel of the first upper semiconductor layer, and forming a second upper gate electrode on the gate insulating layer, the second upper gate electrode overlapping a channel of the second lower semiconductor layer on the gate insulating layer.

The first source lower semiconductor layer and the first drain lower semiconductor layer may be separated from each other.

The first source lower semiconductor layer and the first drain lower semiconductor layer may be separated from each other.

A method for manufacturing a display device according to another exemplary embodiment of the present invention includes: sequentially forming a lower semiconductor material and a conductive layer on a substrate; etching the lower semiconductor material and the conductive layer to form a first source lower semiconductor layer, a first drain lower semiconductor layer, a first lower semiconductor layer, a first source electrode, and a first drain electrode of an infrared ray sensing transistor, and a second lower semiconductor layer and a data conductive pattern of a readout transistor; forming a separating layer on a portion of the first lower semiconductor layer that is exposed between the first source electrode and the first drain electrode; forming an upper semiconductor material on the first source electrode, the first drain electrode, the separating layer, and the data conductive pattern; etching the upper semiconductor material and the data conductive pattern to form a first upper semiconductor layer of the infrared ray sensing transistor, and a second source electrode, a second drain electrode, a second source upper semiconductor layer, and a second drain upper semiconductor layer of a readout transistor; and forming a gate insulating layer on the first upper semiconductor layer, the second source upper semiconductor layer, the second drain upper semiconductor layer, and the second lower semiconductor layer, wherein the second source upper semiconductor layer and the second drain upper semiconductor layer of the readout transistor are separated from each other.

The gate insulating layer may be formed on a portion of the second lower semiconductor layer that is exposed between the second source electrode and the second drain electrode.

The separating layer may include a nitrogen oxide layer formed through a plasma treatment.

Forming a lower ohmic contact material between the lower semiconductor material and the conductive layer, and forming an upper ohmic contact material on the conductive layer, may be further included.

Before forming the lower semiconductor material, a light blocking material and a gate conductive layer are sequentially formed, the light blocking material and the gate conductive layer are etched to form a light blocking film and a second lower gate electrode of the readout transistor, and a blocking insulating layer is formed on the substrate, the light blocking film, and the second lower gate electrode.

The etching the light blocking material may further comprises=forming the light blocking film and the second lower gate electrode of the readout transistor by etching the light blocking material and the gate conductive layer with a first photosensitive film pattern positioned on the gate conductive layer, the first photosensitive film pattern including a first portion and a second portion that is thinner than the first portion.

The etching the lower semiconductor material may further comprise forming the first lower semiconductor layer of the infrared ray sensing transistor, the first source electrode, the first drain electrode, and the second lower semiconductor layer of the readout transistor, and the data conductive pattern by etching the lower semiconductor material and the data conductive layer with a second photosensitive film pattern positioned on the conductive layer, the second photosensitive film pattern including a first portion and a second portion that is thinner than the first portion.

The method may also include forming a first upper gate electrode on the gate insulating layer, the first upper gate electrode overlapping a channel of the first upper semiconductor layer, and forming a second upper gate electrode on the gate insulating layer, the second upper gate electrode overlapping a channel of the second lower semiconductor layer.

The second source upper semiconductor layer and the second drain upper semiconductor layer may be separated from each other.

According to an exemplary embodiment of the present invention, the infrared ray sensing transistor may have a semiconductor layer made of amorphous silicon germanium, and the visible ray sensing transistor and the readout transistor may have a semiconductor layer made of amorphous silicon, so as to be formed through fewer photolithography processes, saving manufacturing time and expense.

BRIEF DESCRIPTION OF THE DRAWINGS

Like reference numerals refer to corresponding parts throughout the drawings. Also, it is understood that the depictions in the figures are diagrammatic and not necessarily to scale.

DETAILED DESCRIPTION OF THE EMBODIMENTS

Figure 1:
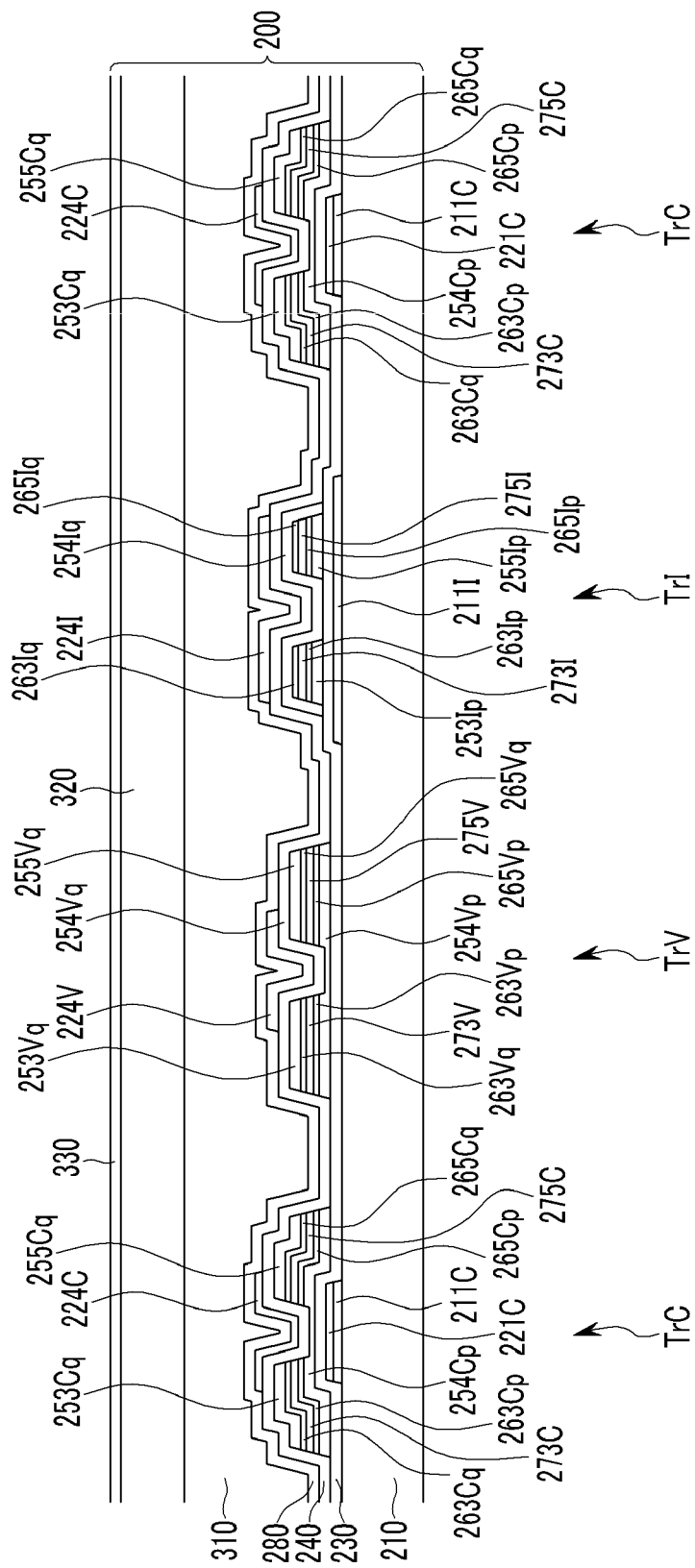
FIG. 1 is a cross-sectional view of an upper panel of a display device according to an exemplary embodiment of the present invention.

Exemplary embodiments of the present invention will be hereinafter described in detail with reference to the accompanying drawings. The structural shapes, sizes, ratios, numbers, etc. are schematically illustrated in the accompanying drawings such that they may be altered more or less. The drawings are shown from the viewpoint of observation such that the direction or location of explaining the drawings may be variously changed depending upon the position of the observer. Even when reference is made to different elements, like reference numerals may be used to designate those elements. When the terms "include," "have," "consist of," or the like are used, the relevant subject may include other parts unless the term "only" is used to define the contents thereof. When explanation is made by way of a singular term, it may be interpreted in a plural manner as well as in a singular manner. Even when the numerical values, shapes, size comparisons, positional relations, etc. are not explained with the adverb "about" or "substantially," they may be so interpreted to include the common error ranges. Even when the terms of "after," "before," "and," "here," "subsequently," or the like are introduced, they are not meant to define temporal locations. The terms "the first," "the second," . . . , etc. are used only for convenience in distinction selectively, commutatively, or repeatedly, and are not meant to be read in any defined manners. It will be understood that when an element is referred to as being "on," "over," "above," "below," or "beside" another element, it can be directly on the other element or one or more intervening elements may also be present. When the connective "or" is used to connect two elements, it is meant to indicate the respective elements and a combination thereof, but when the quantifier "any one of" is attached to the connective, it is meant to indicate only the respective elements.

A display device according to an exemplary embodiment of the present invention is now described with reference to FIG. 1. FIG. 1 shows a liquid crystal display. However, one of ordinary skill in the art will observe that the methods and approaches of the present exemplary embodiment may be applied to various display devices besides LCDs.

FIG. 1 is a cross-sectional view of an upper panel of a display device according to an exemplary embodiment of the present invention.

As shown in FIG. 1, an upper panel 200 includes an upper substrate 210 made of transparent glass or plastic, and sensing transistors TrI and TrV. The sensing transistors TrI and TrV may include at least one infrared ray sensing transistor TrI and at least one visible ray sensing transistor TrV. The infrared ray sensing transistor TrI and the visible ray sensing transistor TrV may be generally uniformly distributed upon the whole upper panel 200, so as to sense infrared rays and visible light on the whole region of the upper panel 200. However, the invention includes any distribution of transistors TrV and TrI. As examples, the infrared ray sensing transistor TrI and the visible ray sensing transistor TrV may be placed in alternating manner, may be arranged according to any predetermined ratio, or may be placed in no particular manner (e.g., randomly or pseudorandomly placed). In the present exemplary embodiment, the infrared ray sensing transistor TrI and the visible ray sensing transistor TrV are alternately arranged.

The upper panel 200 may further include a readout transistor TrC that connects to the infrared ray sensing transistor TrI and the visible light sensing transistor TrV, and that transmits a detected signal. Here, the readout transistor TrC may be disposed relatively close to the sensing transistors TrI and TrV.

The infrared ray sensing transistor TrI, visible ray sensing transistor TrV, and the readout transistor TrC may each be positioned on the upper substrate 210.

In detail, the infrared ray sensing transistor TrI may include lower semiconductor layers 253Ip and 255Ip, lower ohmic contact layers 263Ip and 265Ip, a source electrode 273I, a drain electrode 275I, upper ohmic contact layers 263Iq and 265Iq, an upper semiconductor layer 254Iq, a gate insulating layer 240, and an upper gate electrode 224I.

A light blocking film 211I is disposed on the upper substrate 210, and at least partially overlaps the upper semiconductor layer 254Iq. The light blocking film 211I prevents the upper semiconductor layer 254Iq from being exposed to visible rays. Accordingly, the light blocking film 211I may include a material that blocks visible rays incident on the film 211I from outside the liquid crystal display. For example, the light blocking film 211I may include an organic material or amorphous silicon including black pigments.

The light blocking film 211I blocks visible rays that are incident to the liquid crystal display from external sources (e.g., ambient, or environmental, light). This improves the signal-to-noise ratio (SNR) of the display, and also improves the sensitivity of the upper semiconductor layer 254Iq (which can include amorphous silicon germanium or amorphous germanium) to infrared radiation by reducing the influence of visible rays.

A blocking insulating layer 230, made of an insulating material such as silicon nitride, is formed on the upper substrate 210 and the light blocking film 211I. It is preferable that the thickness of the blocking insulating layer 230 be in the range of about 3000 Å to about 10,000 Å. When the thickness of the blocking insulating layer 230 is less than about 3000 Å, the minute charges accumulated in the light blocking film 211I may affect the sensitivity of the upper semiconductor layer 254Iq, and when the thickness of the blocking insulating layer 230 is larger than 10,000 Å, the thickness of the transistor may not be thin. A lower gate electrode (not shown) may be disposed on a portion of the light blocking film 211I, and may be connected to the upper gate electrode 224I. In this case, a light blocking film 211I that contacts the lower gate electrode (not shown) helps to reduce the number of operational errors of the transistor caused by the light blocking film 211I itself. That is, when the light blocking film 211I is separated from the lower gate electrode (not shown), the light blocking film 211I absorbs external light, thereby generating minute charges within. If not dissipated, these charges can influence the operation of the transistor. Accordingly, the light blocking film 211I is connected to the upper gate electrode 224I through the lower gate electrode (not shown) so that the gate voltage is applied to the light blocking film 211I, clearing the accumulated minute charges and thereby reducing operation errors caused by the light blocking film 211I.

The channels of the lower semiconductor layers 253Ip and 255Ip and the upper semiconductor layer 254Iq are disposed on the blocking insulating layer 230. Also, the upper semiconductor layer 254Iq contacts the side surface of the lower semiconductor layers 253Ip and 255Ip. The lower semiconductor layers 253Ip and 255Ip may include amorphous silicon, and the upper semiconductor layer 254Iq may include amorphous silicon germanium or amorphous germanium. When the upper semiconductor layer 254Iq is made of amorphous silicon germanium or amorphous germanium, the resulting infrared ray sensing transistor TrI has excellent sensitivity. It is preferable that the thickness of the semiconductor layer 254I is in the range of about 3000 Å to about 10,000 Å. When it is less than about 3000 Å, the infrared ray sensitivity is decreased, when it is more than 10000 Å, the transistor may undesirably large.

The lower semiconductor layers 253Ip and 255Ip are divided into a source lower semiconductor layer 253Ip and a drain lower semiconductor layer 255Ip such that the current can not flow through the lower semiconductor layers 253Ip and 255Ip when the gate voltage is appled to the upper gate electrode 224I, and noise due to the current may be prevented. Also, the lower semiconductor layers 253Ip and 255Ip help block the visible-light rays that are incident to the upper semiconductor layer 254Iq from backlight unit 910, thereby improving signal-to-noise ratio (SNR), and improving the sensitivity of the upper semiconductor layer 254Iq to infrared rays region by reducing the influence of visible rays.

The lower ohmic contact layers 263Ip and 265Ip may be disposed on the lower semiconductor layers 253Ip and 255Ip. The source electrode 273I may be disposed on the lower ohmic contact layer 263Ip, and the drain electrode 275I may be disposed on the lower ohmic contact layer 265Ip and separated from the source electrode 273I.

The upper ohmic contact layer 263Iq may be disposed on the source electrode 273I, and the upper ohmic contact layer 265Iq may be disposed on the drain electrode 275I.

The upper semiconductor layer 254Iq may be disposed on the exposed blocking insulating layer 230 between the upper ohmic contact layers 263Iq and 265Iq, and the source electrode 273I and drain electrode 275I.

The gate insulating layer 240 covers the upper semiconductor layer 254Iq. It is preferable that the thickness of the gate insulating layer 240 is in the range of about 3000 Å to about 10,000 Å. When it is less than about 3000 Å, the transistor TrI is insufficiently sensitive to infrared rays, and when it is more than about 10000 Å, the transistor may be too large.

The upper gate electrode 224I may be disposed to overlap the upper semiconductor layer 254Iq on the gate insulating layer 240. This upper gate electrode 224I is opaque to both visible and infrared light, and largely prevents the infrared rays and the visible rays from the backlight unit 910 from being directly incident to the infrared ray sensing transistor TrI. Accordingly, the noise caused by the infrared rays and the visible rays directly incident to the infrared ray sensing transistor TrI from the backlight unit 910 may be substantially eliminated, improving the SNR, sensing margin, and infrared ray sensitivity of transistor TrI.

A passivation layer 280 protects the upper gate electrode 224I, and is formed on the upper gate electrode 224I and the gate insulating layer 240. The passivation layer 280 may include an insulating material such as silicon nitride.

A portion of the source electrode 273I and a portion of the capacitor data line (not shown) overlap each other, thereby forming an infrared ray sensing capacitor Ci, and the infrared rays may be detected through a change in the charge they impart in the infrared ray sensing capacitor Ci.

The readout transistor TrC transmits the input signal to the source electrode 273C connected to a readout line (not shown), and may be connected to the source electrode 273I of the infrared ray sensing transistor TrI through the drain electrode 275C.

The readout transistor TrC may include a lower semiconductor layer 254Cp, lower ohmic contact layers 263Cp and 265Cp, a source electrode 273C, a drain electrode 275C, upper ohmic contact layers 263Cq and 265Cq, upper semiconductor layers 253Cq and 255Cq, a gate insulating layer 240, a lower gate electrode 221C, and an upper gate electrode 224C.

A light blocking film 211C is disposed on the upper substrate 210, the lower gate electrode 221C is disposed on the light blocking film 211C, and the lower gate electrode 221C overlaps the lower semiconductor layer 254Cp.

The light blocking film 211C blocks infrared and visible rays from reaching the lower semiconductor layer 254Cp, thereby improving the signal-to-noise ratio (SNR) of the transistor TrC.

The blocking insulating layer 230 is formed on the upper substrate 210, thereby covering the lower gate electrode 211C. The blocking insulating layer 230 can include an insulating material such as silicon nitride.

The lower semiconductor layer 254Cp is disposed on the blocking insulating layer 230, and may be made of amorphous silicon. It is preferable that the thickness of the semiconductor layer 254C is in the range of about 500 Å to 3000 Å. When the thickness is less than about 500 Å, it is difficult to fabricate a uniform channel, and when the thickness is greater than about 3000 Å, the transistor may be too large.

The lower ohmic contact layers 263Cp and 265Cp may be disposed on the semiconductor layer 254Cp. The source electrode 273C may be disposed on the lower ohmic contact layer 263Cp, and the drain electrode 275C may be separated from the source electrode 273C on the lower ohmic contact layer 265Cp.

The upper ohmic contact layer 263Cq may be disposed on the source electrode 273C, and the upper ohmic contact layer 265Cq may be disposed on the drain electrode 275C.

The upper semiconductor layer 253Cq may be disposed on the upper ohmic contact layer 263Cq, and the upper semiconductor layer 255Cq may be disposed on the upper ohmic contact layer 265Cq. The upper semiconductor layers 253Cq and 255Cq may be formed of amorphous silicon germanium or amorphous germanium. However, the upper semiconductor layers 253Cq and 255Cq are divided into the source upper semiconductor layer 253Cp and the drain upper semiconductor layer 255Cp, and thereby they may not have the semiconductor characteristic that the current flows through the upper semiconductor layers 253Cq and 255Cq when the gate voltage is appled to the upper gate electrode 224C. The gate insulating layer 240 may be disposed on the channel of the lower semiconductor layer 254Cp and the upper semiconductor layers 253Cq and 255Cq.

The upper gate electrode 224C may overlap the channel of the lower semiconductor layer 254Cp on the gate insulating layer 240. Accordingly, the upper gate electrode 224C blocks infrared and visible rays from the backlight unit 910, largely preventing them from falling incident upon the lower semiconductor layer 254Cp. This helps eliminate that portion of noise that is caused by the irradiation of infrared rays and the visible rays from the backlight unit 910 upon the readout transistor TrC.

Also, similar to light blocking film 211I above, light blocking film 211C may connect to the lower gate electrode 221C, which in turn may be connected to the upper gate electrode 224C. In this manner, the gate voltage is applied to the light blocking film 211C, clearing accumulated charge in film 211C from incident light.

The passivation layer 280 protects the upper gate electrode 224C, and is formed on the upper gate electrode 224C and the gate insulating layer 240.

On the other hand, the visible ray sensing transistor TrV is disposed on the upper substrate 210, and the readout transistor TrC that is electrically connected to the visible ray sensing transistor TrV is disposed with the same layer as the visible ray sensing transistor TrV.

In detail, the visible ray sensing transistor TrV may include a lower semiconductor layer 254Vp, lower ohmic contact layers 263Vp and 265Vp, a source electrode 273V, a drain electrode 275V, lower ohmic contact layers 263Vq and 265Vq, upper semiconductor layers 253Vq and 255Vq, the gate insulating layer 240, and an upper gate electrode 224V.

The blocking insulating layer 230 can include an insulating material such as silicon nitride, and is disposed on the upper substrate 210. The lower semiconductor layer 254Vp can be made of amorphous silicon, and is disposed on the blocking insulating layer 230. It is preferable that the thickness of the lower semiconductor layer 254Vp is in the range of about 500 Å to about 3000 Å. When the thickness is less than about 500 Å, it is difficult to fabricate uniform channels, and when the thickness is greater than about 3000 Å, the resulting transistor may excessively large.

The ohmic contact layers 263Vp and 265Vp may be disposed on the lower semiconductor layer 254Vp. The source electrode 273V may be disposed on the lower ohmic contact layer 263Vp, and the drain electrode 275V may be disposed on the lower ohmic contact layer 265Vp and separated from the source electrode 273V.

The upper ohmic contact layer 263Vq may be disposed on the source electrode 273V, and the upper ohmic contact layer 265Vq may be disposed on the drain electrode 275V.

The upper semiconductor layer 253Vq may be disposed on the upper ohmic contact layer 263Vq, and the upper semiconductor layer 255Vq may be disposed on the upper ohmic contact layer 265Vq. The upper semiconductor layers 253Vq and 255Vq may include amorphous silicon germanium or amorphous germanium. However, the upper semiconductor layers 253Vq and 255Vq are divided into a source upper semiconductor layer 253Vp and a drain upper semiconductor layer 255Vp such that they may not have the semiconductor characteristic that the current flows through the upper semiconductor layers 253Vq and 255Vq when the gate voltage is appled to the upper gate electrode 224V. The gate insulating layer 240 may be disposed on the channel of the lower semiconductor layer 254Vp and the upper semiconductor layers 253Vq and 255Vq.

The upper gate electrode 224V may overlap the channel of the lower semiconductor layer 254Vp on the gate insulating layer 240. Accordingly, the upper gate electrode 224V substantially blocks those infrared and visible rays incident to the lower semiconductor layer 254Vp from the backlight unit 910. This reduces noise in the transistor TrV caused by light from the backlight unit 910.

The passivation layer 280 protecting the upper gate electrode 224V is formed on the upper gate electrode 224V and the gate insulating layer 240.

The readout transistor TrC transmits the input signal to the source electrode 273C connected to the readout line (not shown), and may be connected to the source electrode 273V of the visible ray sensing transistor TrV through the drain electrode 275C.

A portion of the source electrode 273V overlaps a portion of the capacitor data line (not shown) thereby forming the visible ray sensing capacitor Cv, allowing visible rays to be sensed through a change they cause in the charge stored in the visible ray sensing capacitor Cv.

A light blocking member 310 may be formed on the passivation layer 280 covering the infrared ray sensing transistor TrI, the visible ray sensing transistor TrV, and the readout transistor TrC. The light blocking member 310 prevents the infrared rays and visible rays generated from the backlight unit 910 from being incident to the infrared ray sensing transistor TrI and the visible ray sensing transistor TrV, and prevents external light (both infrared and visible) from being incident to the pixel transistor TrP.

An overcoat 320 is formed on the light blocking member 310. The overcoat 320 may be made of an organic layer for planarization. A common electrode 330 is formed on the overcoat 320, and can be made of ITO or IZO.

As described above, the infrared ray sensing transistor including the amorphous silicon germanium is formed, and the visible ray sensing transistor and the readout transistor including the amorphous silicon are formed. Therefore, the present invention increases the reliability of LCD touch-sensitive devices in the dark environment.

Figure 2:
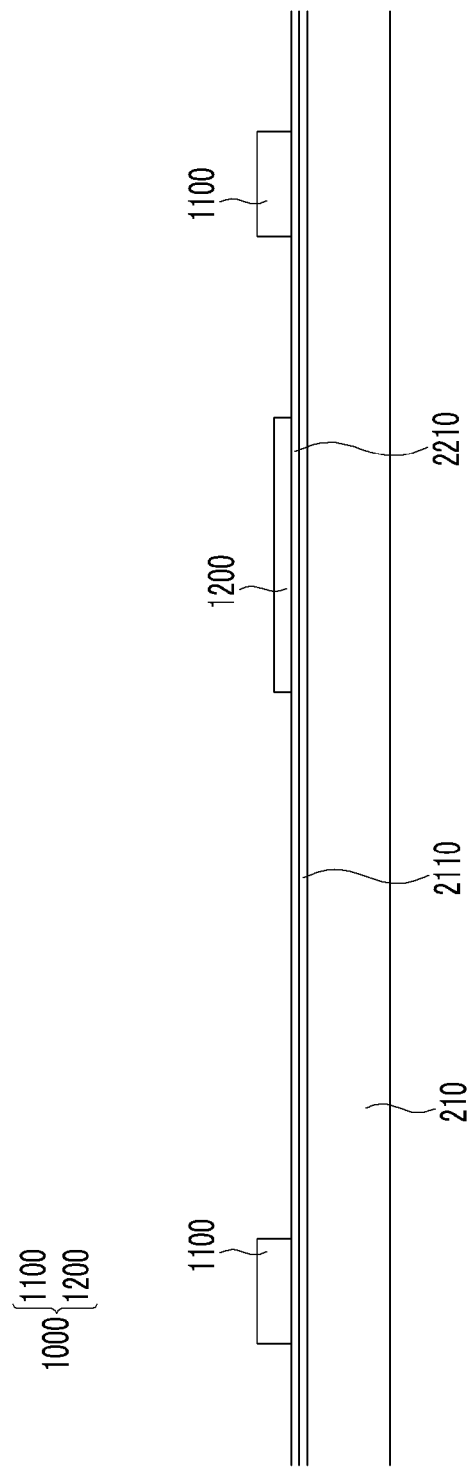
FIG. 2 to FIG. 8 are cross-sectional views sequentially showing a manufacturing method for the display device shown in FIG. 1.

FIG. 2 to FIG. 8 are cross-sectional views sequentially showing a method of manufacturing the display device shown in FIG. 1. First, as shown in FIG. 2, a light blocking material 2110 and a gate conductive layer 2210 are formed on a substrate 210. The light blocking material 2110 can be made of any suitable material, such as an organic material or an amorphous silicon that includes black pigments. Next, a first photosensitive film pattern 1000, including a first portion 1100 and a second portion 1200 having a thinner thickness than the first portion 1100, is formed on the gate conductive layer 2210.

Figure 3:
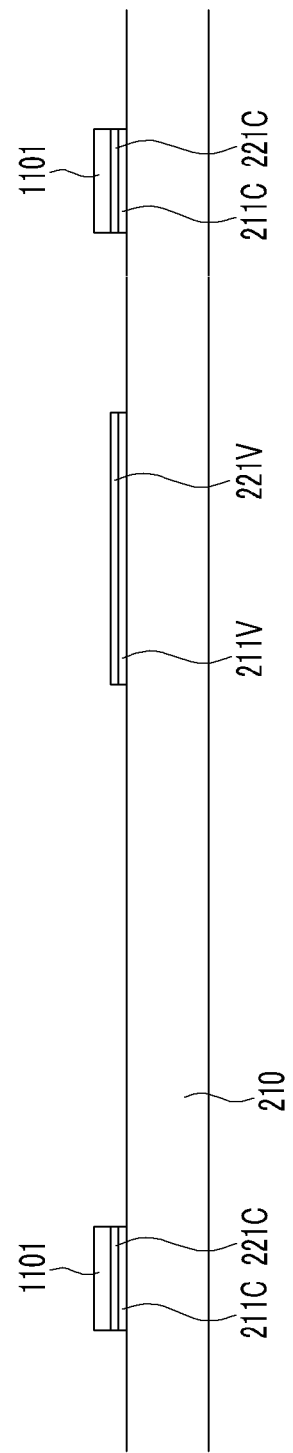

Next, as shown in FIG. 3, the light blocking material and the gate conductive layer are etched by using the first photosensitive film pattern 1000 as a mask, to form light blocking films 211C and 211V, as well as lower gate electrodes 221C and 221V. Next, the first photosensitive film pattern 1000 is etched back to remove the second portion 1200, thereby exposing the lower gate electrode 221V and reducing the thickness of the first portion 1100 so as to form a thinner third portion 1101. Next, the exposed lower gate electrode 221V is etched to expose the light blocking film 211V. Next, the first photosensitive film pattern 1000 is removed.

Figure 4:
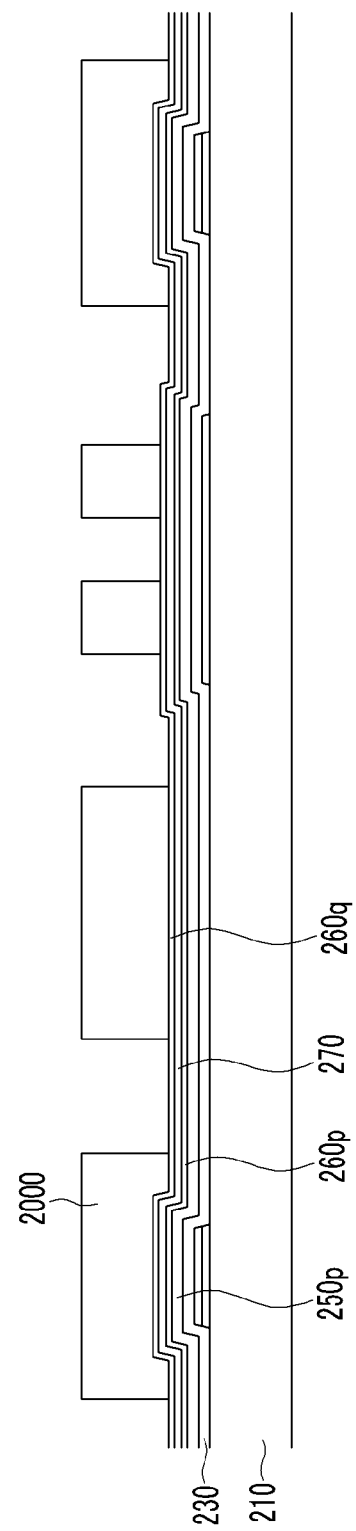

Next, as shown in FIG. 4, a blocking insulating layer 230 is formed. This blocking insulating layer 230 can be made of an insulating material such as silicon nitride, and covers the upper substrate 210, the light blocking film 211V, and the lower gate electrode 221C. Next, a lower semiconductor material 250p, a lower ohmic contact material 260p, a data conductive layer 270, and an upper ohmic contact material 260q are sequentially formed on the blocking insulating layer 230. Here, the lower semiconductor material 250C may be made of amorphous silicon. The second photosensitive film pattern 2000 is then formed on the upper ohmic contact material 260q.

Figure 5:
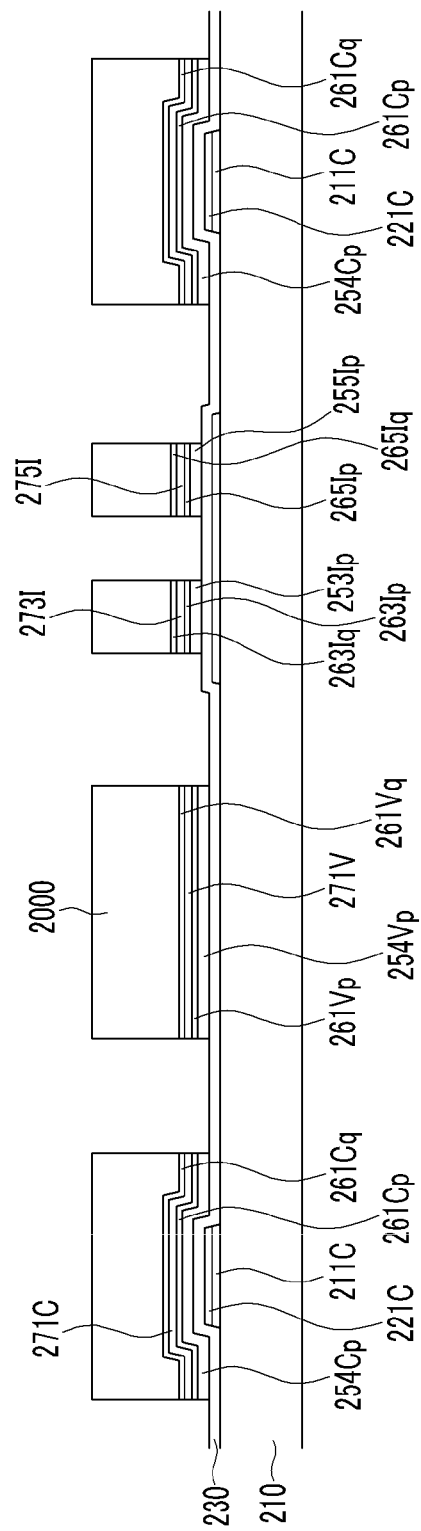

Next, as shown in FIG. 5, the lower semiconductor material 250p, the lower ohmic contact material 260p, the data conductive layer 270, and the upper ohmic contact material 260q are etched by using the second photosensitive film pattern 2000 as a mask to form lower semiconductor layers 253Ip and 255Ip, lower ohmic contact layers 263Ip and 265Ip, a source electrode 273I, a drain electrode 275I, and upper ohmic contact layers 263Iq and 265Iq of the infrared ray sensing transistor TrI. This also simultaneously forms lower semiconductor layer 254Cp, lower ohmic contact pattern 261Cp, data conductive pattern 271C, and upper ohmic contact pattern 261Cq of the readout transistor TrC. This etching also forms lower semiconductor layer 254Vp, lower ohmic contact pattern 261Vp, data conductive pattern 271V, and upper ohmic contact pattern 261Vq of the visible ray sensing transistor TrV.

Here, the lower semiconductor layers 253Ip and 255Ip are divided into a source lower semiconductor layer 253Ip and a drain lower semiconductor layer 255Ip such that the current can not flow through the lower semiconductor layers 253Ip and 255Ip when the gate voltage is appled to the upper gate electrode 224I, and the noise caused by the current may be prevented. It is preferable that the upper ohmic contact material 260q is dry-etched, the data conductive layer 270 is wet-etched, and the lower ohmic contact material 260p and the lower semiconductor material 250p are dry-etched. The upper ohmic contact material 260q, the lower ohmic contact material 260p and the lower semiconductor material 250p are dry-etched since the thickness of the upper ohmic contact material 260q, the lower ohmic contact material 260p and the lower semiconductor material 250p are thin.

Next, the second photosensitive film pattern 2000 is removed.

Figure 6:
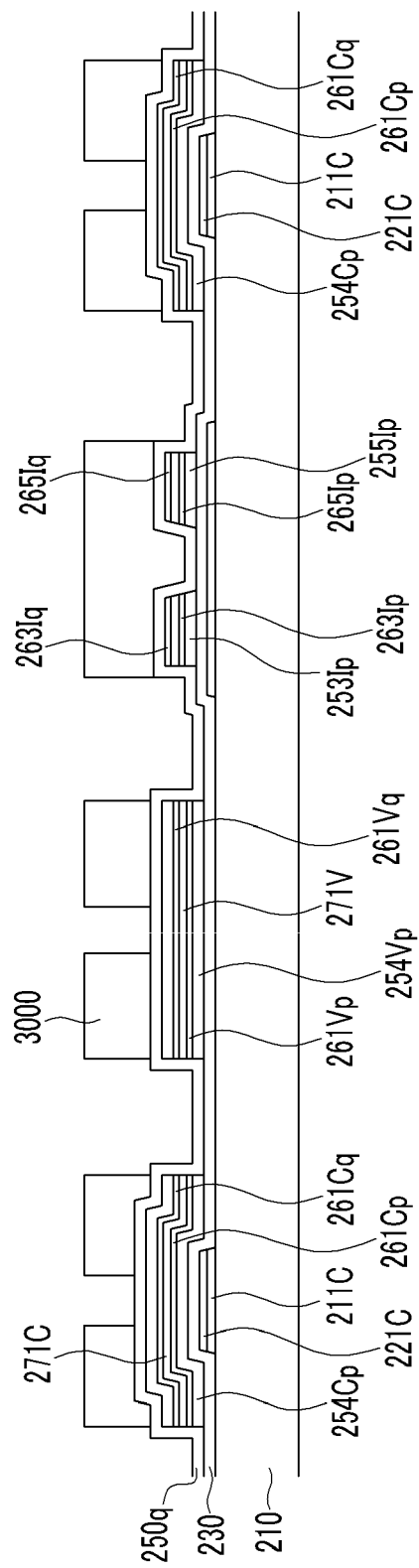

Next, as shown in FIG. 6, an upper semiconductor material 250q is formed on the upper ohmic contact layers 263Iq and 265Iq of the infrared ray sensing transistor TrI, the upper ohmic contact pattern 261Cq of the readout transistor TrC, the upper ohmic contact pattern 261Vq of the visible ray sensing transistor TrV, and the blocking insulating layer 230. Here, the upper semiconductor material 250q may be made of amorphous silicon germanium or amorphous germanium.

Next, a third photosensitive film pattern 3000 is formed on the upper semiconductor material 250q.

Figure 7:
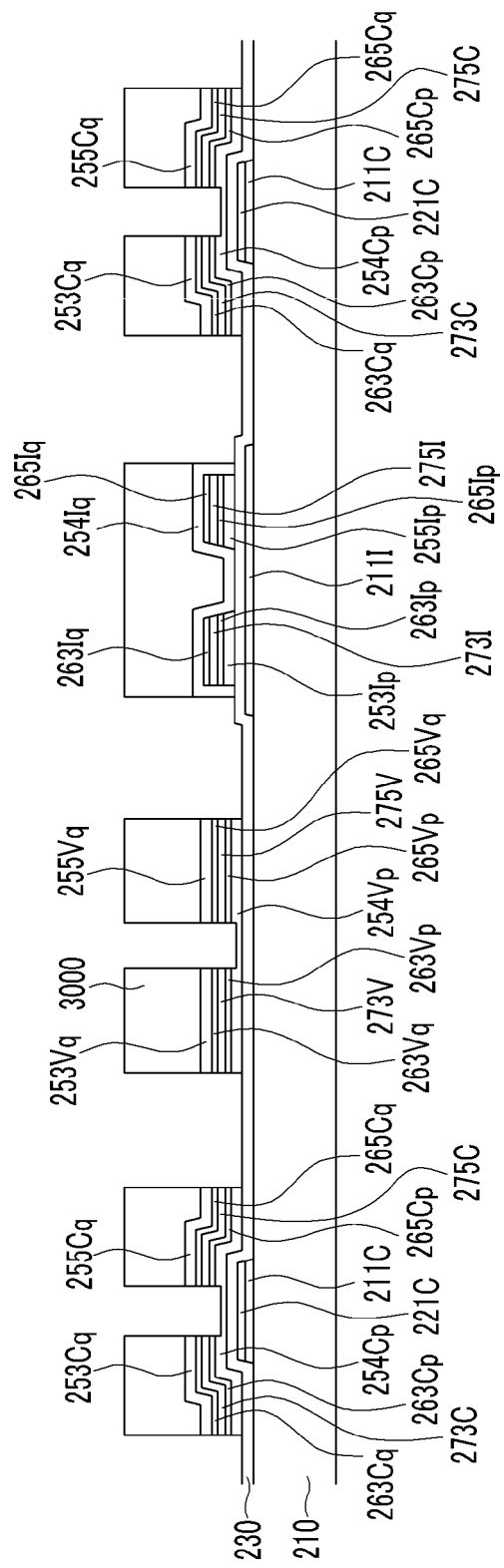

Next, as shown in FIG. 7, the underlying layers are etched by using the third photosensitive film pattern 3000 as a mask to form an upper semiconductor layer 254Iq of the infrared ray sensing transistor TrI. This etching also simultaneously forms lower ohmic contact layers 263Cp and 265Cp, a source electrode 273C, a drain electrode 275C, upper ohmic contact layers 263Cq and 265Cq, and upper semiconductor layers 253Cq and 255Cq of the readout transistor TrC. This step also forms lower ohmic contact layers 263Vp and 265Vp, a source electrode 273V, a drain electrode 275V, lower ohmic contact layers 263Vq and 265Vq, and upper semiconductor layers 253Vq and 255Vq of the visible ray sensing transistor TrV. Next, the third photosensitive film pattern 3000 is removed.

Figure 8:
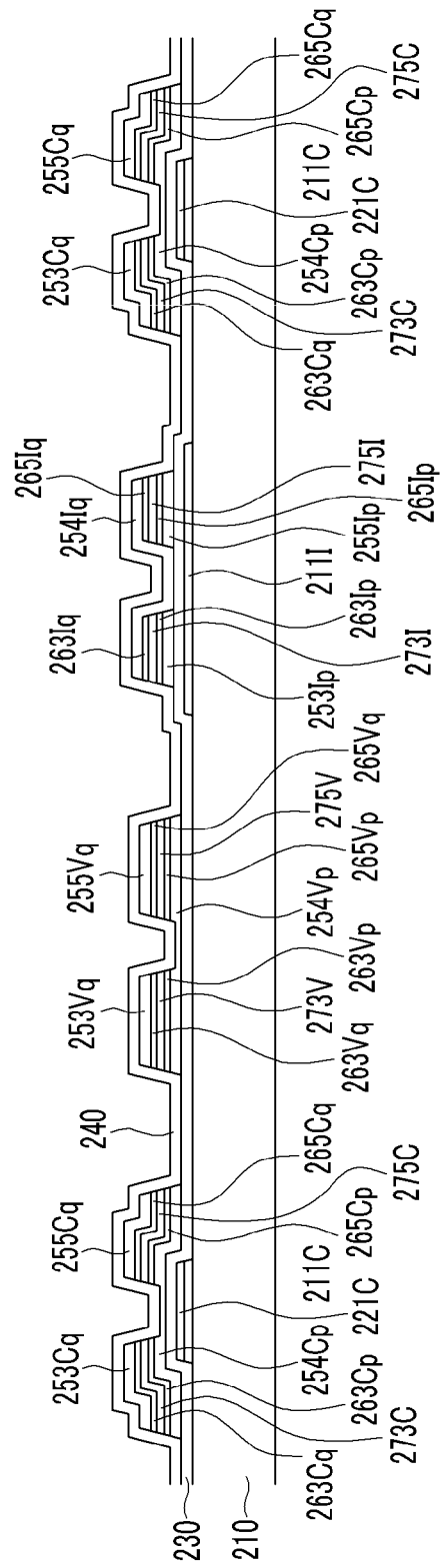

Next, as shown in FIG. 8, a gate insulating layer 240 is formed on the upper semiconductor layer 254Iq of the infrared ray sensing transistor TrI, the upper semiconductor layers 253Cq and 255Cq of the readout transistor TrC, and the upper semiconductor layers 253Vq and 255Vq of the visible ray sensing transistor TrV and the blocking insulating layer 230.

Next, as shown in FIG. 1, upper gate electrodes 224V, 224I, and 224C are formed on the gate insulating layer 240. The upper gate electrodes 224V and 224C overlap the lower semiconductor layers 254Vp and 254Cp, and the upper gate electrode 224I overlaps the upper semiconductor layer 254Iq. Next, a passivation layer 280, a light blocking member 310, an overcoat 320, and a common electrode 330 are sequentially formed on the upper gate electrodes 224V, 224I, and 224C.

As described above, the infrared ray sensing transistor, the visible ray sensing transistor, and the readout transistor are formed by using the second photosensitive film pattern and the third photosensitive film pattern in the same process, such that the number of photolithography processes used in fabricating the infrared ray sensing transistor, the visible ray sensing transistor, and the readout transistor may be reduced.

Figure 9:
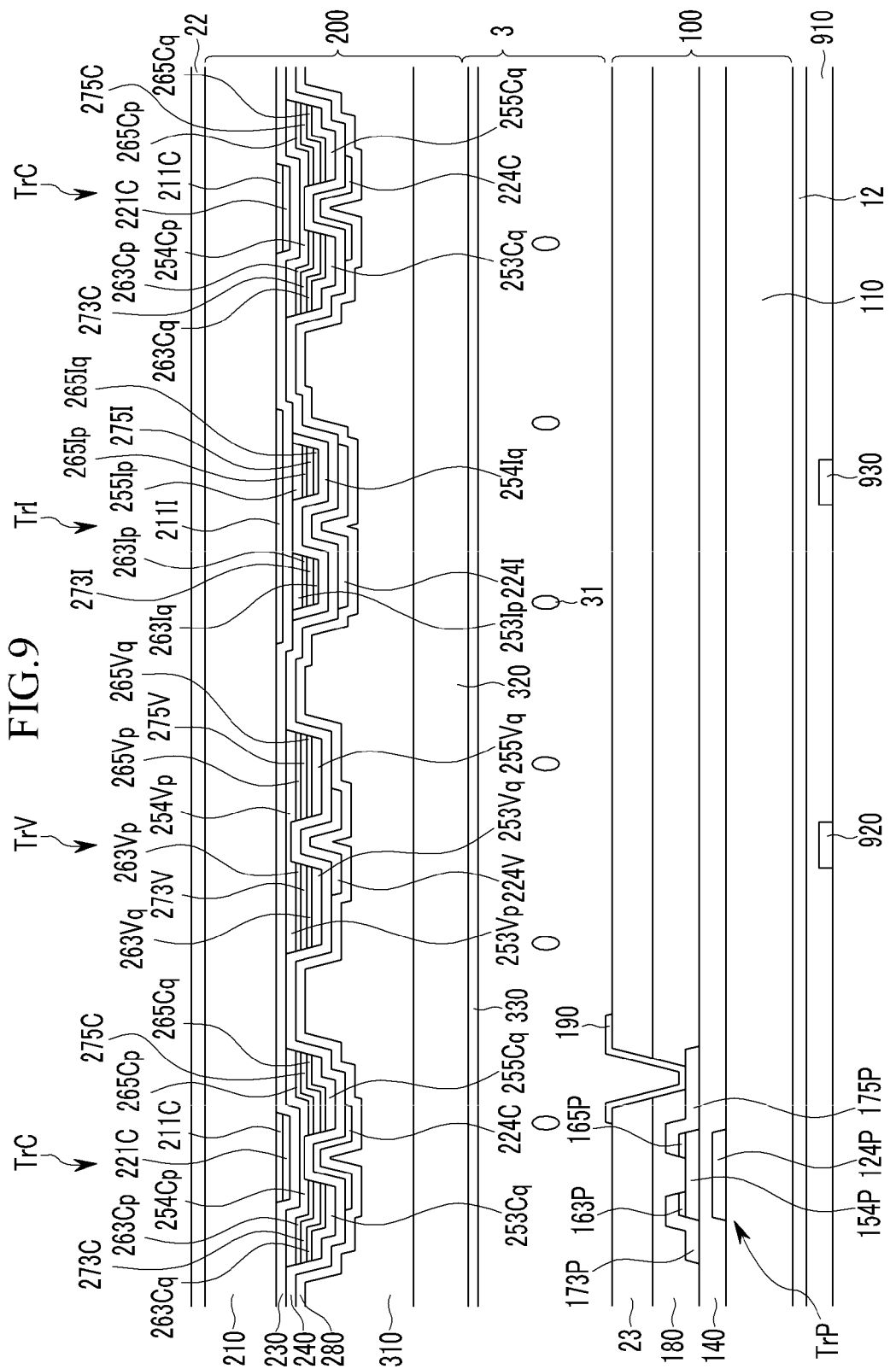
FIG. 9 is a cross-sectional view of a display device constructed according to an exemplary embodiment of the present invention.

FIG. 9 is a cross-sectional view of a display device according to a further exemplary embodiment of the present invention.

As shown in FIG. 9, a display device includes a lower panel 100 and an upper panel 200 facing each other, and a liquid crystal layer 3 interposed between the two display panels 100 and 200.

The liquid crystal layer 3 has negative dielectric anisotropy, and liquid crystal molecules 31 of the liquid crystal layer 3 may be aligned such that their major axes are perpendicular to the surfaces of the two display panels when an electric field is not applied.

Alignment layers (not shown) may be formed on the inner surfaces of the display panels 100 and 200, and they may be vertical alignment layers.

The display device may further include a lower polarizer 12 disposed under the lower panel 100, and an upper polarizer 22 disposed on the upper panel 200. The intensity of the light provided to the lower panel 100 and the upper panel 200 may be controlled by controlling the polarization characteristics of the lower polarizer 12 and the upper polarizer 22.

The display device may further include a backlight unit 910 disposed under the lower panel 100. In this embodiment, the backlight unit 910 includes at least one infrared ray emitting member 920 and at least one visible ray emitting member 930. The infrared ray emitting member 920 and the visible ray emitting member 930 may be point light sources such as light-emitting devices (LEDs). Also, the infrared rays and the visible rays respectively emitted from the infrared ray emitting member 920 and the visible ray emitting member 930 may be incident to the lower panel in a direction generally perpendicular to the panel.

The infrared ray emitting member 920 and the visible ray emitting member 930 may be generally uniformly distributed across the whole surface of the backlight unit 910, or at least a substantial portion thereof, so that substantially the entire surface of the backlight unit 910 (or a substantial portion thereof) emits infrared and visible light. The invention contemplates any arrangement and number of infrared and visible light emitters. For example, the members 920, 930 may be arranged in alternating fashion, may be arranged according to some predetermined ratio of members 920 to members 930, or may be arranged in a random, pseudorandom, or arbitrary manner.

The lower panel 100 includes a lower substrate 110 made of transparent glass or plastic, and a pixel transistor TrP disposed on the lower substrate 110. The pixel transistor TrP includes a gate electrode 124p formed on the lower substrate 110, a gate insulating layer 140 covering the lower substrate 110 and the gate electrode 124P, a semiconductor layer 154P overlapping the gate electrode 124P and disposed on the gate insulating layer 140, ohmic contact layers 163P and 165P disposed on the semiconductor layer 154P, a source electrode 173P disposed on the ohmic contact layer 163P, and a drain electrode 175P separated from the source electrode 173P on the ohmic contact layer 165P.

The lower panel 100 may further include a gate line disposed on the lower substrate 110 and a data line intersecting the gate line. Here, the gate line may be connected to the gate electrode 124P of the pixel transistor TrP. Also, the data line may be connected to the source electrode 173P of the pixel transistor TrP.

The lower panel 100 may further include a passivation layer 180 covering the pixel transistor TrP, a color filter 23 disposed on the passivation layer 180, an overcoat 25 disposed on the color filter 23, and a pixel electrode 190 disposed on the overcoat 25. Here, the pixel electrode 190 may be connected to the drain electrode 175P of the pixel transistor TrP while passing through the overcoat 25 and the passivation layer 180.

Figure 10:
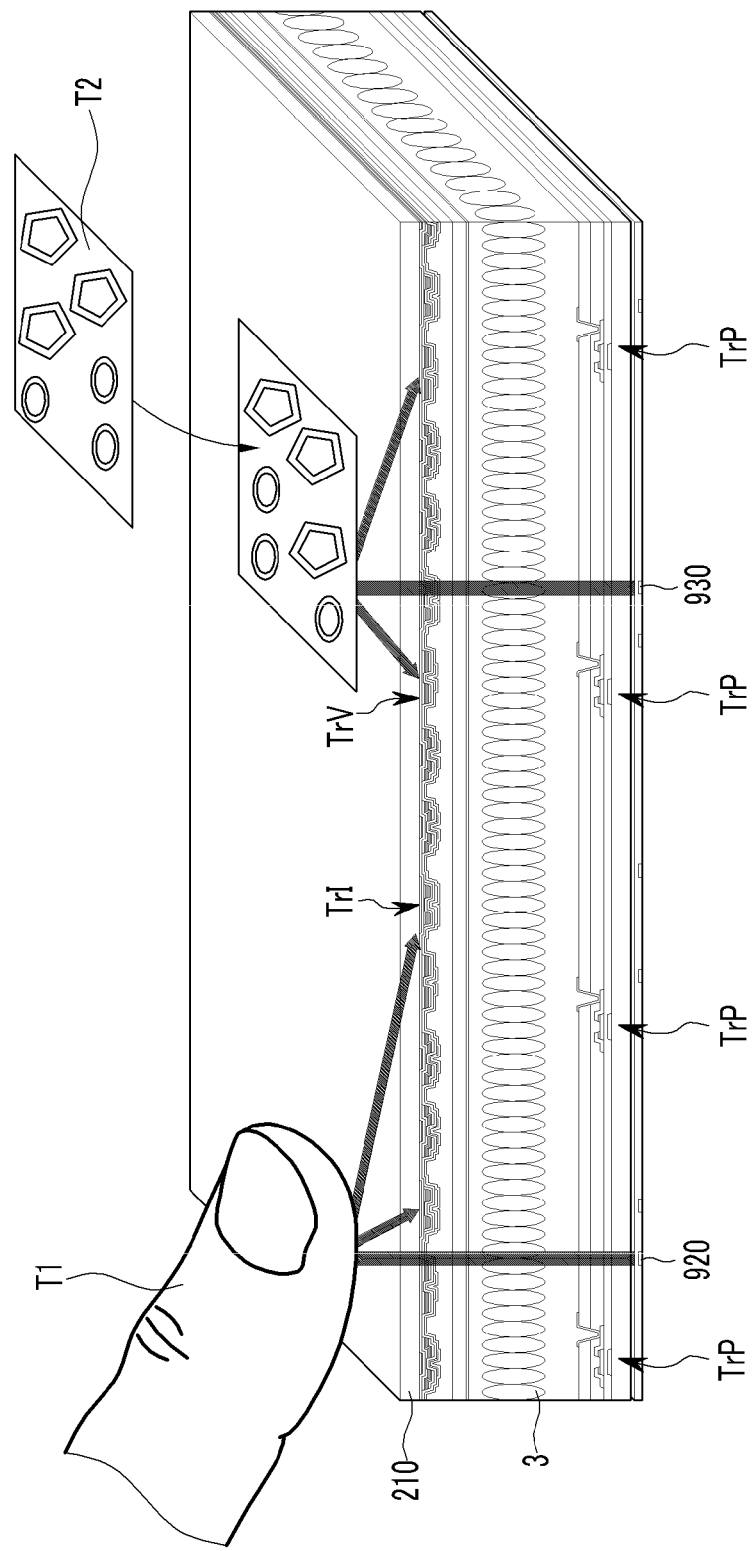
FIG. 10 is a view explaining a method for sensing an object by using the display device of FIG. 9.

FIG. 10 is an isometric cutaway view illustrating the sensing of an object by using the display device of FIG. 9.

As shown in FIG. 10, infrared rays and visible rays are generated in the backlight unit 910. The infrared rays sequentially pass the lower polarizer 12, the lower panel 100, the liquid crystal layer 3, the upper panel 200, and the upper polarizer 22.

The visible rays sequentially pass the lower polarizer 12, the lower panel 100, the liquid crystal layer 3, the upper panel 200, and the upper polarizer 22. Here, the visible rays may be made any desirable color by the color filter 23 of the lower panel 100.

For touch sensing of a first object T1 positioned on the liquid crystal display, the infrared rays provided from the backlight unit 910 may be used. When the first object T1 is close to the liquid crystal display, the infrared rays emitted from the liquid crystal display are reflected by the first object T1. The reflected infrared rays are incident to, and detected by, the infrared ray sensors TrI positioned in the upper panel 200. The number and locations of sensors TrI that detect object T1 are used to determine whether and where a "touch" has occurred, as well as the size and shape of the contact.

When the visible light emitted from the LCD panel is brighter than the ambient light, visible light from the LCD panel can be used for image sensing. This is illustrated in connection with second object T2, which is shown in FIG. 10 as being moved proximate to the LCD. When object T2 is moved sufficiently close, it reflects visible light from the LCD. This reflected visible light is incident to, and detected by, the visible ray sensor TrV positioned in the upper panel 200. The number and locations of sensors TrV that detect object T2 are used to determine the presence of object T2 (i.e., whether it has "touched" the LCD), as well as the size, shape, and color of the object.

After confirming the contact portion of the second object T2 through touch sensing, the visible light emitted from the liquid crystal display may be selectively changed, to more accurately sense the second object T2. That is, once an object such as object T2 is detected through one mechanism (e.g., infrared sensing), another mechanism (e.g., visible light) can be adjusted to further sense the object. For example, when the visible light emitted from the liquid crystal display is darker than the ambient visible light, the object T2 can be first detected by infrared rays. Once detection has occurred, the visible rays emitted from the liquid crystal display can be selectively brightened, e.g., only in areas close to the object T2, such that more effective image sensing of the second object T2 is possible.

Figure 11:
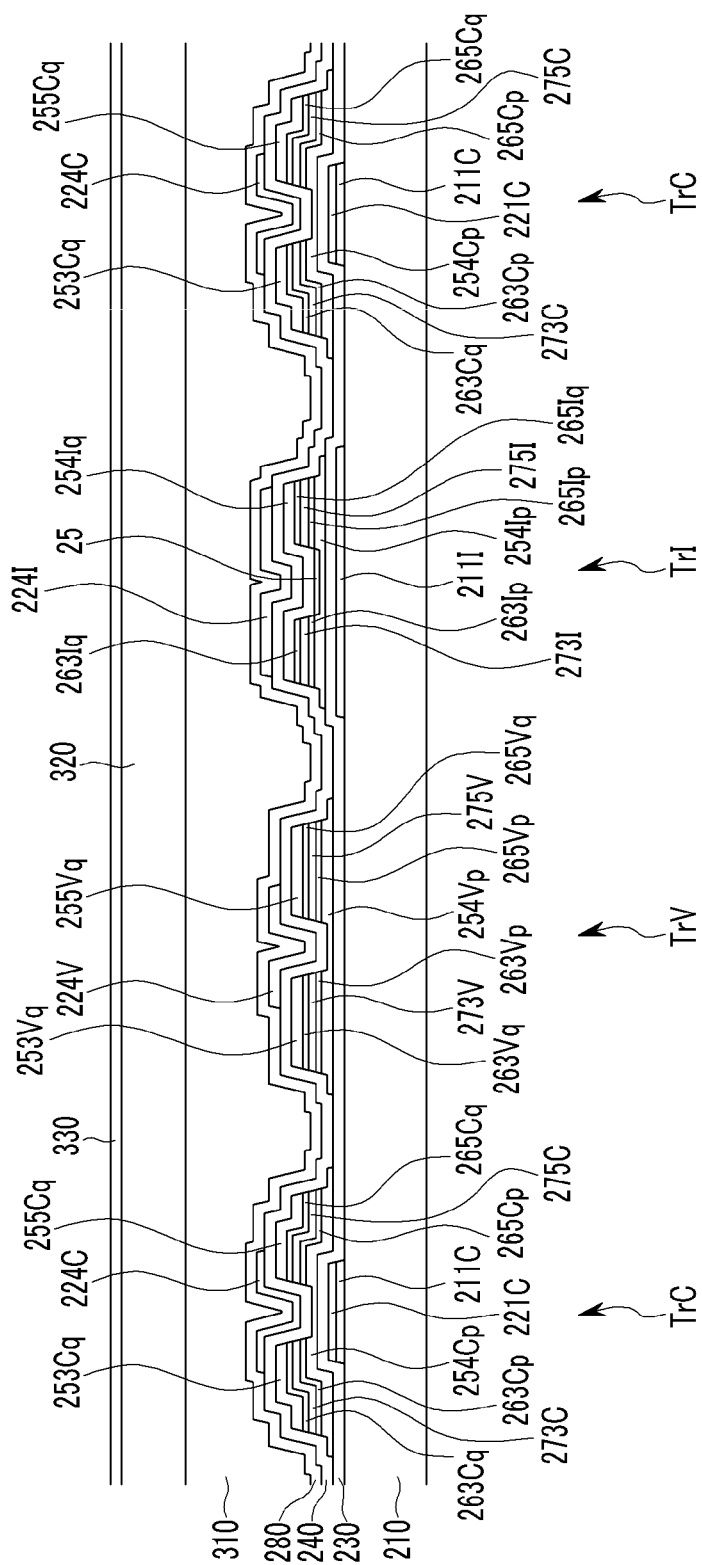
FIG. 11 is a cross-sectional view of a display device according to another exemplary embodiment of the present invention.

FIG. 11 is a cross-sectional view of a display device according to another exemplary embodiment of the present invention.

This embodiment is substantially the same as the exemplary embodiment shown in FIG. 1, except that the lower semiconductor layers of the infrared ray sensing transistor TrI are not divided. Description of those elements that remain largely unchanged from FIG. 1 is thus largely omitted.

In FIG. 11, a lower semiconductor layer 254Ip is positioned on the blocking insulating layer 230, and a separating layer 25 is formed on the channel of the lower semiconductor layer 254Ip. The separating layer 25 may be a nitrogen oxide layer formed through a plasma treatment.

Lower ohmic contact layers 263Ip and 265Ip are positioned on the lower semiconductor layer 254Ip. A source electrode 273I is positioned on the lower ohmic contact layer 263Ip, and a drain electrode 275I is separated from the source electrode 273I on the lower ohmic contact layer 265Ip. An upper ohmic contact layer 263Iq is positioned on the source electrode 273I, and an upper ohmic contact layer 265Iq is positioned on the drain electrode 275I.

The upper semiconductor layer 254Iq may be positioned on the exposed separating layer 25 between the upper ohmic contact layers 263Iq and 265Iq, as well as the source electrode 273I and the drain electrode 275I.

The lower semiconductor layer 254Ip can include amorphous silicon, and the upper semiconductor layer 254Iq can include amorphous silicon germanium or amorphous germanium. The separating layer 25 separates the lower semiconductor layer 254Ip and the upper semiconductor layer 254Iq, thereby preventing noise caused by the lower semiconductor layer 254Ip. This allows the infrared ray sensing transistor TrI, which utilizes the upper semiconductor layer 254Iq, to have greater infrared ray sensitivity.

Figure 12:
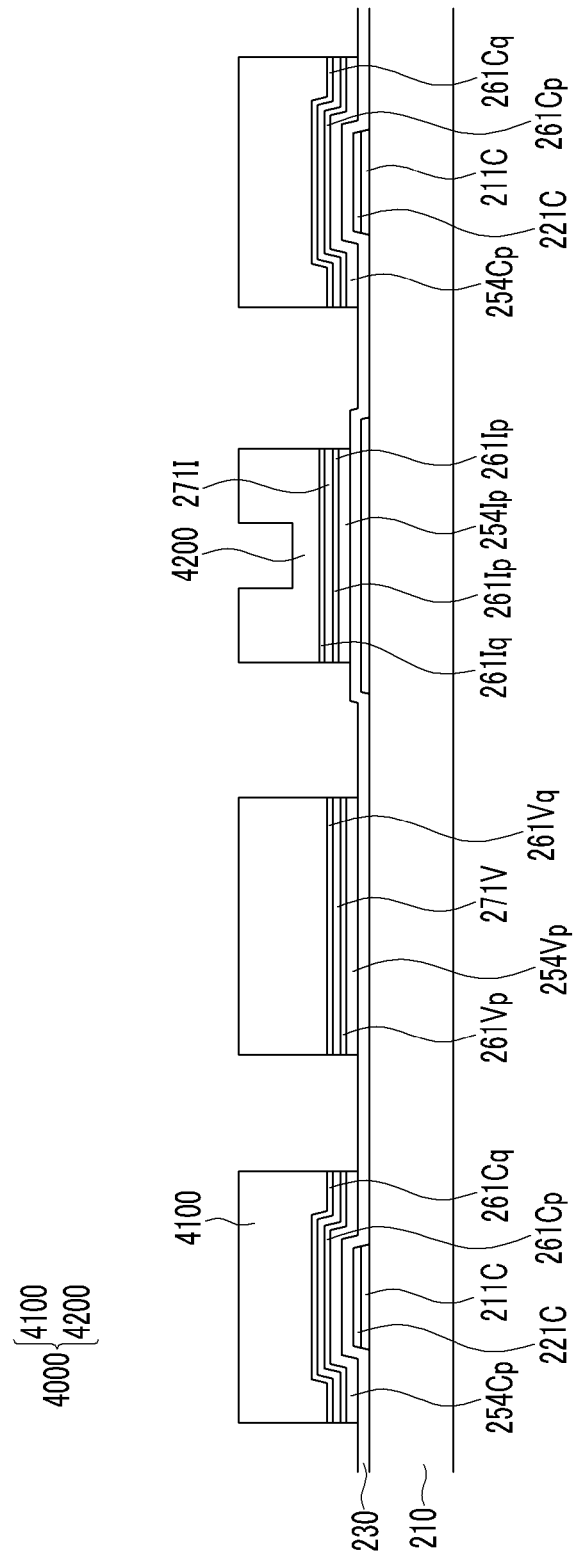
FIG. 12 to FIG. 14 are cross-sectional views sequentially showing an exemplary manufacturing method for the liquid crystal display shown in FIG. 11.
Figure 13:
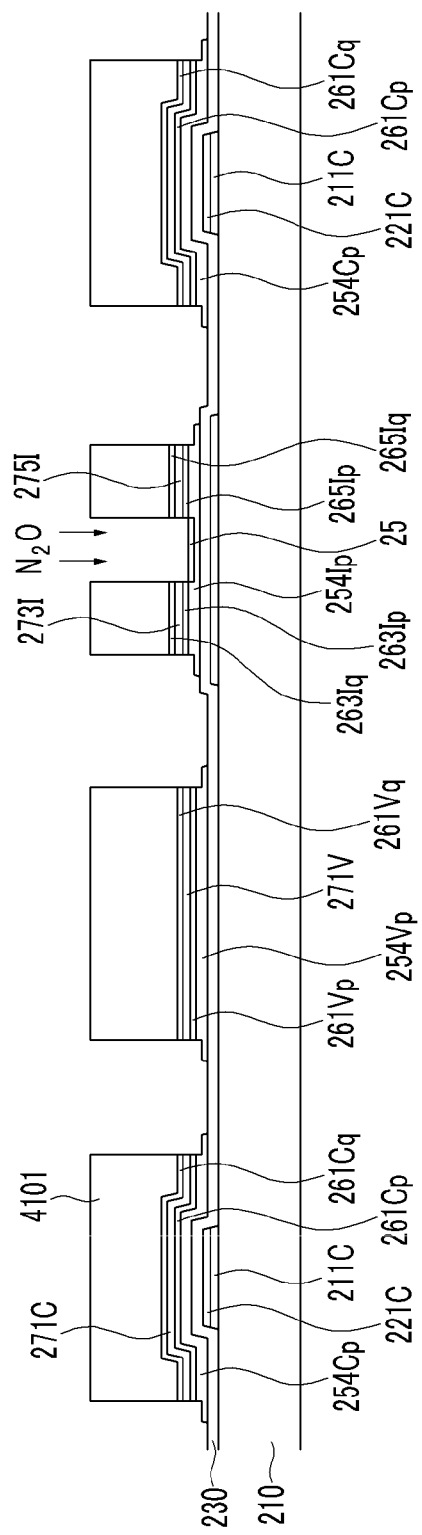
Figure 14:
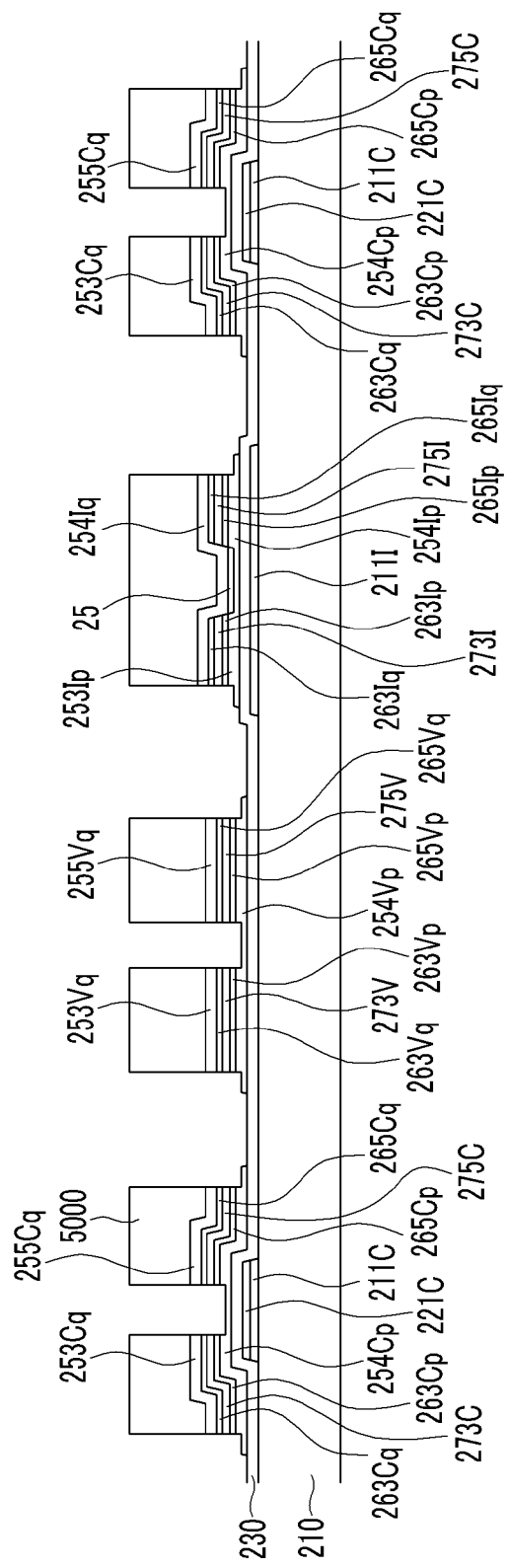

FIG. 12 to FIG. 14 are cross-sectional views sequentially showing a manufacturing method of an exemplary embodiment for a liquid crystal display shown in FIG. 11. A manufacturing method for the liquid crystal display shown in FIG. 11 will be described with reference to FIGS. 12 to 14.

The present exemplary embodiment is substantially the same as the exemplary embodiment shown in FIG. 1 to FIG. 8, except that the lower semiconductor layers of the infrared ray sensing transistor TrI are not divided. Description of those elements that remain unchanged from previous figures is thus largely omitted.

As shown in FIG. 12, a fourth photosensitive film pattern 4000 is formed on the upper ohmic contact material 260p. The pattern 4000 includes a first portion 4100, and a second portion 4200 that is thinner than the first portion 4100.

Next, a lower semiconductor material 250p, a lower ohmic contact material 260p, a data conductive layer 270, and an upper ohmic contact material 260q are etched by using the fourth photosensitive film pattern 4000 as a mask. This forms lower semiconductor layer 254Ip, lower ohmic contact pattern 261Ip, data conductive pattern 271I, and upper ohmic contact pattern 261Iq of the infrared ray sensing transistor TrI. This etching also simultaneously forms lower semiconductor layer 254Cp, lower ohmic contact pattern 261Cp, data conductive pattern 271C, and upper ohmic contact pattern 261Cq of the readout transistor TrC. This etching also forms lower semiconductor layer 254Vp, lower ohmic contact pattern 261Vp, data conductive pattern 271V, and upper ohmic contact pattern 261Vq of the visible ray sensing transistor TrV.

Next, as shown in FIG. 13, the fourth photosensitive film pattern 4000 is etched back to remove the second portion 4200, thereby exposing the upper ohmic contact pattern 261Iq of the infrared ray sensing transistor TrI. Also, the exposed upper ohmic contact pattern 261Iq, the underlying data conductive pattern 271I, and the lower ohmic contact pattern 261Ip are etched to form upper ohmic contact layers 263Iq and 265Iq, a source electrode 273I, a drain electrode 275I, and lower ohmic contact layers 263Ip and 265Ip. Here, the lower semiconductor layer 254Ip of the infrared ray sensing transistor TrI is exposed, and the first portion 4100 is etched so as to form a third portion 4101 having a reduced thickness.

Next, a process such as plasma treatment using nitrogen oxide (N2O) is executed to form a separating layer 25 at the channel of the exposed lower semiconductor layer 254Ip of the infrared ray sensing transistor TrI. The separating layer 25 can be formed as a nitrogen oxide layer.

Next, as shown in FIG. 14, the fourth photosensitive film pattern 4000 is removed. After that, an upper semiconductor material 250q is formed on the upper ohmic contact layers 263Iq and 265Iq of the infrared ray sensing transistor TrI, the upper ohmic contact pattern 261Cq of the readout transistor TrC, the upper ohmic contact pattern 261Vq of the visible ray sensing transistor TrV, and the blocking insulating layer 230. Here, the upper semiconductor material 250q may be made of amorphous silicon germanium or amorphous germanium. Next, a fifth photosensitive film pattern 5000 is formed on the upper semiconductor material 250q. Then, the underlying layers are etched by using the fifth photosensitive film pattern 5000 as a mask to form an upper semiconductor layer 254Iq of the infrared ray sensing transistor TrI. This also simultaneously forms lower ohmic contact layers 263Cp and 265Cp, source electrode 273C, drain electrode 275C, upper ohmic contact layers 263Cq and 265Cq, and upper semiconductor layers 253Cq and 255Cq of the readout transistor TrC. This etching also forms lower ohmic contact layers 263Vp and 265Vp, source electrode 273V, drain electrode 275V, upper ohmic contact layers 263Vq and 265Vq, and upper semiconductor layers 253Vq and 255Vq of the visible ray sensing transistor TrV. Then, the fifth photosensitive film pattern 5000 is removed.

Next, as shown in FIG. 11, a gate insulating layer 240 is formed on the upper semiconductor layer 254Iq of the infrared ray sensing transistor TrI, the upper semiconductor layers 253Cq and 255Cq of the readout transistor TrC, the upper semiconductor layers 253Vq and 255Vq of the visible ray sensing transistor TrV, and the blocking insulating layer 230. Afterward, upper gate electrodes 224V, 224I, and 224C are formed on the gate insulating layer 240. The upper gate electrodes 224V and 224C overlap the lower semiconductor layers 254Vp and 254Cp, and the upper gate electrode 224I overlaps the upper semiconductor layer 254Iq. Next, a passivation layer 280, a light blocking member 310, an overcoat 320, and a common electrode 330 are formed on the upper gate electrodes 224V, 224I, and 224C.

As described above, the infrared ray sensing transistor, the visible ray sensing transistor, and the readout transistor are formed by using the second photosensitive film pattern and the third photosensitive film pattern in the same process, such that the number of photolithography processes for manufacturing the infrared ray sensing transistor, the visible ray sensing transistor, and the readout transistor may be reduced.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display device comprising:
    a lower panel including a lower substrate and a pixel transistor disposed on the lower substrate; and
    an upper panel facing the lower panel and including an upper substrate, an infrared ray sensing transistor disposed on the upper substrate, and a readout transistor connected to the infrared ray sensing transistor so as to be configured to transmit a detection signal,
    wherein the infrared ray sensing transistor includes a first lower semiconductor layer disposed on the upper substrate, a first source electrode and a first drain electrode each disposed on the first lower semiconductor layer, a first upper semiconductor layer disposed on the first source electrode and the first drain electrode, a first gate electrode overlapping the first upper semiconductor layer, and
    a separating layer disposed between the first lower semiconductor layer and a channel of the first upper semiconductor layer, the channel of the first semiconductor layer positioned between the first source electrode and first drain electrode;
    wherein ends of the separating layer are substantially coplanar with ends of the first source and first drain electrodes.

2. The display device of claim 1, wherein the separating layer includes a nitrogen oxide.

3. The display device of claim 1, wherein the readout transistor includes a second lower gate electrode disposed on the upper substrate, a second lower semiconductor layer disposed on the second gate electrode and overlapping the second gate electrode, a second source electrode and a second drain electrode each positioned on the second lower semiconductor layer, a second source upper semiconductor layer and a second drain upper semiconductor layer respectively disposed on the second source electrode and the second drain electrode and separated from each other, and a second upper gate electrode overlapping the second lower semiconductor layer.

4. The display device of claim 3, wherein
the first upper semiconductor layer, the second source upper semiconductor layer, and the second drain upper semiconductor layer each include amorphous silicon germanium, and the first lower semiconductor layer and the second lower semiconductor layer each include amorphous silicon.

5. The display device of claim 1, further comprising
a light blocking film disposed between the upper substrate and the first lower semiconductor layer, and under the second lower gate electrode.

6. The display device of claim 5, further comprising:
a first lower ohmic contact layer having a first surface facing the first lower semiconductor layer and the first source electrode, and a second surface facing the first lower semiconductor layer and the first drain electrode, and
a first upper ohmic contact layer having a first surface facing the first source electrode and the first upper semiconductor layer, and a second surface facing the first drain electrode and the first upper semiconductor layer.

7. The display device of claim 6, further comprising
a second lower ohmic contact layer having a first surface facing the second lower semiconductor layer and the second source electrode, and a second surface facing the second lower semiconductor layer and the second drain electrode, and
a second upper ohmic contact layer having a first surface facing the second source electrode and the second source upper semiconductor layer, and a second surface facing the second drain electrode and the second source upper semiconductor layer.

\* \* \* \* \*